US012751035B2

(12) United States Patent
Zhang et al.

(10) Patent No.: US 12,751,035 B2
(45) Date of Patent: Sep. 29, 2026

(54) EPITAXIAL STRUCTURE OF SEMICONDUCTOR DEVICE AND MANUFACTURING METHOD THEREOF, AND SEMICONDUCTOR DEVICE

(71) Applicant: DYNAX SEMICONDUCTOR, INC., Kunshan (CN)

(72) Inventors: Hui Zhang, Kunshan (CN); Shiqiang Li, Kunshan (CN)

(73) Assignee: DYNAX SEMICONDUCTOR, INC., Kunshan (CN)

(*) Notice: Subject to any disclaimer, the term of this patent is extended or adjusted under 35 U.S.C. 154(b) by 466 days.

(21) Appl. No.: 18/551,263

(22) PCT Filed: Mar. 16, 2022

(86) PCT No.: PCT/CN2022/081163

§ 371 (c)(1),
(2) Date: Sep. 19, 2023

(87) PCT Pub. No.: WO2022/194199

PCT Pub. Date: Sep. 22, 2022

(65) Prior Publication Data

US 2024/0178312 A1 May 30, 2024

(30) Foreign Application Priority Data

Mar. 19, 2021 (CN) ......................... 202110296026.5

(51) Int. Cl.
*H10D 30/47* (2025.01)
*H10D 62/53* (2025.01)
(Continued)

(52) U.S. Cl.
CPC ........... *H10D 30/475* (2025.01); *H10D 62/53* (2025.01); *H10D 62/8503* (2025.01); *H10P 14/3416* (2026.01); *H10P 50/242* (2026.01)

(58) Field of Classification Search
CPC .... H10D 30/01; H10D 30/015; H10D 30/021; H10D 30/47; H10D 30/4732;
(Continued)

(56) References Cited

U.S. PATENT DOCUMENTS 5,548,140 A * 8/1996 Nguyen ............... H10D 62/824 257/14
2009/0008657 A1 1/2009 Wang
(Continued)

FOREIGN PATENT DOCUMENTS

CN 105895585 A 8/2016
JP 2002261027 A 9/2002

OTHER PUBLICATIONS

PCT International Search Report and Written Opinion, Application No. PCT/CN2022/081163, dated Apr. 26, 2022, 8 pages: with English translation.

*Primary Examiner* — Britt Hanley
*Assistant Examiner* — Kevin Quinto
(74) *Attorney, Agent, or Firm* — Armstrong Teasdale LLP

(57) ABSTRACT

Embodiments of the present disclosure relate to an epitaxial structure of a semiconductor device and a manufacturing method thereof, and a semiconductor device. The epitaxial structure of the semiconductor device includes a substrate, and an epitaxial layer located on one side of the substrate, the epitaxial layer including at least a first sub-epitaxial layer group, the first sub-epitaxial layer group including a first sub-epitaxial layer and a second sub-epitaxial layer arranged in stack, wherein a surface of one side of the first sub-epitaxial layer away from the substrate includes a plurality of first dislocation pits, and sidewalls of the first dislocation pits intersect both a plane where the first sub-epitaxial layer is located and a first direction, and the second sub-epitaxial layer covers at least the sidewalls of the first dislocation pits.

9 Claims, 5 Drawing Sheets

(51) Int. Cl.

| | |
|---|---|
| ***H10D 62/85*** | (2025.01) |
| ***H10P 14/20*** | (2026.01) |
| ***H10P 50/24*** | (2026.01) |

(58) Field of Classification Search

CPC .... H10D 30/475; H10D 30/60; H10D 30/801; H10D 30/83; H10D 30/87; H10D 62/10; H10D 62/124; H10D 62/343; H10D 62/357; H10D 62/53; H10D 62/8503; H10P 14/24; H10P 14/2908; H10P 14/3216; H10P 14/3251; H10P 14/3416; H10P 50/242

See application file for complete search history.

(56) References Cited

U.S. PATENT DOCUMENTS

| | | | | |
|---|---|---|---|---|
| 2013/0248818 | A1 * | 9/2013 | Choi | H10H 20/811 438/46 |
| 2014/0264379 | A1 * | 9/2014 | Kub | H10D 62/8503 257/77 |
| 2014/0370634 | A1 * | 12/2014 | Lee | H10P 14/3416 438/46 |

* cited by examiner

EPITAXIAL STRUCTURE OF SEMICONDUCTOR DEVICE AND MANUFACTURING METHOD THEREOF, AND SEMICONDUCTOR DEVICE

CROSS REFERENCE TO RELATED APPLICATIONS

This patent application is a National Stage Entry of PCT/CN2022/081163 filed on Mar. 16, 2022, which claims the benefit and priority of Chinese Patent Application No. 202110296026.5 filed on Mar. 19, 2021, the disclosures of which are incorporated by reference herein in their entirety as part of the present application.

BACKGROUND

Embodiments of the present disclosure relate to the technical field of semiconductor, and particularly relates to an epitaxial structure of a semiconductor device, a manufacturing method thereof, and a semiconductor device.

The current manufacturing of GaN-based optoelectronic and power devices primarily utilizes SiC, Si, and sapphire as substrates. Due to the thermal mismatch and lattice mismatch between the GaN epitaxial layer and the substrate, a significant number of dislocations are generated, and the thermal mismatch stress and lattice mismatch strain incurred during the epitaxial growth process result in deformation of the epitaxial wafer, leading to decreased uniformity of the epitaxial layer and a reduction in product yield, thereby increasing costs.

The most direct method to enhance the quality of GaN crystals is by employing GaN homoepitaxial substrates; however, due to the limitations of the inherent physical properties of GaN, the growth of GaN bulk single crystals is very difficult and has not yet been put into practical use. The remaining methods to optimize the quality of GaN are more common through optimization of process conditions; however, it is actually found that although the quality of GaN crystals after process optimization has been improved, there is a leakage problem. Therefore, conventional methods for improving crystal quality often bring about other problems, and the extent of improving crystal quality is limited.

BRIEF DESCRIPTION

Embodiments of the present disclosure provide an epitaxial structure of a semiconductor device, a manufacturing method thereof, and a semiconductor device, so as to provide an epitaxial structure with good epitaxial uniformity, high product yield, and low cost.

In a first aspect, embodiments of the present disclosure provide an epitaxial structure of a semiconductor device, the epitaxial structure including a substrate, and an epitaxial layer located on one side of the substrate, the epitaxial layer including at least a first sub-epitaxial layer group, the first sub-epitaxial layer group including a first sub-epitaxial layer and a second sub-epitaxial layer arranged in stack, the second sub-epitaxial layer being located on one side of the first sub-epitaxial layer away from the substrate, wherein a surface of one side of the first sub-epitaxial layer away from the substrate includes a plurality of first dislocation pits, and sidewalls of the first dislocation pits intersect both a plane where the first sub-epitaxial layer is located and a first direction, the first direction being parallel to a direction in which the first sub-epitaxial layer points towards the second sub-epitaxial layer; layer, and the second sub-epitaxial layer covers at least the sidewalls of the first dislocation pits.

Along the first direction, depth of the first dislocation pit may be h and thickness of the first sub-epitaxial layer may be H1;

where $1/20H1 \le h \le 1/2H1$.

May be $5\ nm \le h \le 60\ nm$, and $H1 > 100\ nm$.

Along the first direction, depth of the first dislocation pit may be h and thickness of the second sub-epitaxial layer may be H2;

where $H2 > h$.

The first sub-epitaxial layer and the second sub-epitaxial layer both may include one or more of AlN, GaN, AlGaN, and InGaN.

A surface of one side of the first sub-epitaxial layer away from the substrate may include a plurality of first dislocation pits formed by corrosive gas etching, and along the first direction, depth of the first dislocation pits may be h, the corrosive gas may include chlorine gas, the first sub-epitaxial layer and the second sub-epitaxial layer both may include GaN, and introduction time of the chlorine gas may be t1, where $1/3h \le t1 \le h$, or the first sub-epitaxial layer and the second sub-epitaxial layer may include AlN and/or AlGaN, and introduction time of the chlorine gas may be t2, where $2/3h \le t2 \le 2h$.

The epitaxial layer may further include a second sub-epitaxial layer group located on one side of the first sub-epitaxial layer group away from the substrate, the second sub-epitaxial layer group may include the second sub-epitaxial layer and a third sub-epitaxial layer, the third sub-epitaxial layer being located on one side of the second sub-epitaxial layer away from the substrate, and a surface of one side of the second sub-epitaxial layer away from the substrate includes a plurality of second dislocation pits, and sidewalls of the second dislocation pits intersect both a plane where the second sub-epitaxial layer is located and the first direction, and the third sub-epitaxial layer covers at least the sidewalls of the second dislocation pits.

In a second aspect, embodiments of the present disclosure provide a method of manufacturing an epitaxial structure of a semiconductor device, for manufacturing the epitaxial structure in the first aspect, including providing a substrate, forming a first sub-epitaxial layer group on one side of the substrate, wherein forming a first sub-epitaxial layer group on one side of the substrate includes forming a first sub-epitaxial layer on one side of the substrate, forming a plurality of first dislocation pits on one side of the first sub-epitaxial layer away from the substrate, sidewalls of the first dislocation pits intersect both a plane where the first sub-epitaxial layer is located and a first direction, the first direction being parallel to a direction in which the first sub-epitaxial layer points towards the second sub-epitaxial layer, and forming a second sub-epitaxial layer on one side of the first sub-epitaxial layer away from the substrate, the second sub-epitaxial layer covering at least the sidewalls of the first dislocation pits.

The manufacturing may further include forming a second sub-epitaxial layer group on one side of the first sub-epitaxial layer group away from the substrate, wherein forming a second sub-epitaxial layer group on one side of the first sub-epitaxial layer group away from the substrate includes forming a plurality of second dislocation pits on one side of the second sub-epitaxial layer away from the substrate, wherein sidewalls of the second dislocation pits intersect both a plane where the second sub-epitaxial layer is located and the first direction, and forming a third sub-epitaxial layer on one side of the second sub-epitaxial layer away from the substrate, the third sub-epitaxial layer covering at least the sidewalls of the second dislocation pits, wherein the second sub-epitaxial layer group includes the second sub-epitaxial layer and the third sub-epitaxial layer.

In a third aspect, embodiments of the present disclosure provide a semiconductor device including the epitaxial structure in the first aspect, the epitaxial structure including a substrate as well as a nucleation layer, a first sub-epitaxial layer group, a channel layer, a spacer layer, a barrier layer, and a cap layer sequentially located on one side of the substrate, wherein the semiconductor device further includes a source and a drain located on one side of the barrier layer away from the substrate, and a gate located on one side of the cap layer away from the substrate, the gate being located between the source and the drain.

In the embodiments of the present disclosure, by arranging the epitaxial layer to at least include a first sub-epitaxial layer group composed of a first sub-epitaxial layer and a second sub-epitaxial layer, a surface of one side of the first sub-epitaxial layer away from the substrate to include a plurality of first dislocation pits, wherein sidewalls of the first dislocation pits intersect both a plane where the first sub-epitaxial layer is located and a first direction, and the second sub-epitaxial layer to at least cover the sidewalls of the first dislocation pits, the second sub-epitaxial layer grows along the sidewalls of the first dislocation pits, most of the dislocations in the second sub-epitaxial layer that originally extended upward along the first direction change their extension direction at the first dislocation pit, and the dislocations bend, thereby reducing most of the dislocations extending upward along the first direction, improving the uniformity of the epitaxial layer, improving crystal quality and product yield, and reducing costs.

BRIEF DESCRIPTION OF THE DRAWINGS

In order to explain the embodiments of the present disclosure or the technical solutions in the prior art more clearly, drawings that need to be used in the description of the embodiments or the prior art will be briefly introduced below; obviously, the drawings in the following description, which are some specific embodiments of the present disclosure though, for those skilled in the art, according to the basic concepts of device structures, driving methods and manufacturing methods disclosed and suggested by various embodiments of the present disclosure, can be expanded and extended to other structures and drawings, which should undoubtedly fall within the scope of the claims of the present disclosure.

DETAILED DESCRIPTION

Figure 1:
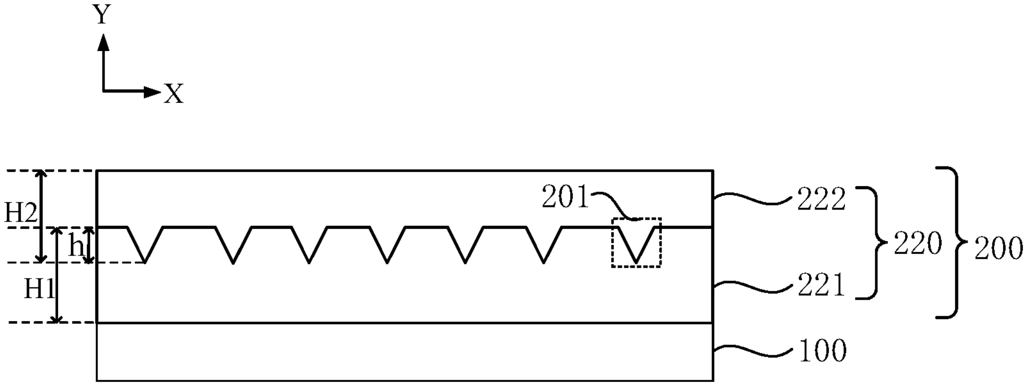
FIG. 1 is a schematic structural diagram of an epitaxial structure of a semiconductor device provided by an embodiment of the present disclosure.

In order to clarify the technical solution and advantages of the present disclosure, the technical solutions of the present disclosure will be clearly and completely described through implementation in conjunction with the drawings in the embodiments of the present disclosure. Obviously, the embodiments to be described refer to a part of the embodiments of the present disclosure, other than all of the embodiments. On the basis of the basic concepts disclosed and suggested by the embodiments of the present disclosure, all other embodiments those skilled in the art obtain fall within the scope protected by the present disclosure.

Due to the thermal mismatch and lattice mismatch between the GaN epitaxial layer and the substrate, the epitaxial layer generates more dislocations, and most of the dislocations extend upward along the direction of the substrate toward the epitaxial layer, resulting in a decrease in the uniformity of the epitaxial layer, a decrease in the yield of epitaxial products, and an increase in cost. In order to solve the problem above, embodiments of the present disclosure provide an epitaxial structure of a semiconductor device, the epitaxial structure including a substrate, and an epitaxial layer located on one side of the substrate, the epitaxial layer including at least a first sub-epitaxial layer group, the first sub-epitaxial layer group including a first sub-epitaxial layer and a second sub-epitaxial layer arranged in stack, the second sub-epitaxial layer being located on one side of the first sub-epitaxial layer away from the substrate, wherein a surface of one side of the first sub-epitaxial layer away from the substrate includes a plurality of first dislocation pits, and sidewalls of the first dislocation pits intersect both a plane where the first sub-epitaxial layer is located and a first direction, the first direction being parallel to a direction in which the first sub-epitaxial layer points towards the second sub-epitaxial layer, and the second sub-epitaxial layer covers at least the sidewalls of the first dislocation pits.

In the embodiments of the present disclosure, by arranging the epitaxial layer to at least include a first sub-epitaxial layer group composed of a first sub-epitaxial layer and a second sub-epitaxial layer, a surface of one side of the first sub-epitaxial layer away from the substrate to include a plurality of first dislocation pits, wherein sidewalls of the first dislocation pits intersect both a plane where the first sub-epitaxial layer is located and a first direction, and the second sub-epitaxial layer to at least cover the sidewalls of the first dislocation pits, the second sub-epitaxial layer grows along the sidewalls of the first dislocation pits, most of the dislocations in the second sub-epitaxial layer that originally extended upward along the first direction change their extension direction at the first dislocation pit, and the dislocations bend, thereby reducing most of the dislocations extending upward along the first direction, improving the uniformity of the epitaxial layer, improving crystal quality and product yield, and reducing costs.

The above is the core idea of the present disclosure. The technical solutions in the embodiments of the present disclosure will be described in detail below in conjunction with the drawings in the embodiments of the present disclosure.

Exemplarily, FIG. 1 is a schematic structural diagram of an epitaxial structure of a semiconductor device provided by an embodiment of the present disclosure. As shown in FIG. 1, the epitaxial structure of the semiconductor device provided by this embodiment includes a substrate 100, and an epitaxial layer 200 located on one side of the substrate, the epitaxial layer 200 including at least a first sub-epitaxial layer group 220, the first sub-epitaxial layer group 220 including a first sub-epitaxial layer 221 and a second sub-epitaxial layer 222 arranged in stack, the second sub-epitaxial layer 222 being located on one side of the first sub-epitaxial layer 221 away from the substrate 100, wherein a surface of one side of the first sub-epitaxial layer 221 away from the substrate 100 includes a plurality of first dislocation pits 201, and sidewalls of the first dislocation pits 201 intersect both a plane where the first sub-epitaxial layer 221 is located and a first direction Y, the first direction Y being parallel to a direction in which the first sub-epitaxial layer 221 points towards the second sub-epitaxial layer 222, and the second sub-epitaxial layer 222 covers at least the sidewalls of the first dislocation pits 201.

Specifically, referring to FIG. 1, the epitaxial structure of the semiconductor device provided in this embodiment includes a substrate 100 and an epitaxial layer 200. Exemplarily, the substrate 100 may be a combination of one or more of gallium nitride, aluminum gallium nitride, indium gallium nitride, aluminum indium gallium nitride, indium phosphide, gallium arsenide, silicon carbide, diamond, sapphire, germanium, silicon, or any other material capable of growing a Group III nitride. The epitaxial layer 200 may include a semiconductor material based on a Group III-V compound. The epitaxial layer 200 includes at least a first sub-epitaxial layer group 220 including a first sub-epitaxial layer 221 and a second sub-epitaxial layer 222 arranged in stack. The dislocations on the surface of one side of the first sub-epitaxial layer 221 away from the substrate 100 may be etched into dislocation pits through dry etching or wet etching, to form a first sub-epitaxial layer 221 including a plurality of first dislocation pits 201. The direction parallel to the direction in which the first sub-epitaxial layer 221 points towards the second sub-epitaxial layer 222 is defined as the first direction Y, the direction parallel to the plane where the first sub-epitaxial layer 221 is located is defined as the X direction, and then the sidewalls of the first dislocation pits 201 intersect with both the X direction and the first direction Y.

There are many dislocations on the surface of one side of the first sub-epitaxial layer 221 away from the substrate 100, during etching, the location of the dislocations on the surface of the first sub-epitaxial layer 221 is preferentially etched, and the dislocations are etched into dislocation pits. As shown in FIG. 1, along the first direction Y, the width of the first dislocation pit 201 gradually increases, that is, it is an inverted triangle that is wide at the top and narrow at the bottom. It should be noted that in FIG. 1, the first dislocation pit 201 is an equilateral triangle as an example for illustration, while the shape of the first dislocation pit 201 formed by the actual process may be other irregular inverted triangles.

When the second sub-epitaxial layer 222 continues to grow on the first sub-epitaxial layer 221 including a plurality of first dislocation pits 201, since the first dislocation pit 201 is in the shape of an inverted triangle along the first direction Y, the second sub-epitaxial layer 222 will grow along the sidewalls of the first dislocation pit 201, and most of the dislocations in the second sub-epitaxial layer 222 that originally extended upward along the first direction Y will change their extension direction at the first dislocation pit 201, and the dislocations will bend and extend to the left or right, dislocations extending to the left and right are docked to form similar semicircular rings, leading to the annihilation of dislocations, thus reducing most of the dislocations extending upward along the first direction Y, improving the uniformity of the epitaxial layer, improving crystal quality and product yield and reducing costs.

It should be noted that in this embodiment of the present disclosure, the method of forming dislocation pits is not limited. Any method capable of forming a plurality of first dislocation pits on the surface of one side of the first sub-epitaxial layer away from the substrate and allowing the second sub-epitaxial layer to grow along the sidewalls of the first dislocation pits, causing dislocations to bend and change the direction of most dislocations in the second sub-epitaxial layer, falls within the scope of protection of the present disclosure.

In addition, the second sub-epitaxial layer 222 needs to cover at least the sidewalls of the first dislocation pit 201, that is, the second sub-epitaxial layer 222 may only cover the sidewalls of the first dislocation pit 201 so that the second sub-epitaxial layer 222 grows along the sidewalls of the first dislocation pit 201 and changes the extension direction of the dislocation; alternatively, referring to FIG. 1, the second sub-epitaxial layer 222 fills the first dislocation pit 201 to facilitate the growth of subsequent film layers and further improve the crystal quality.

With the epitaxial structure of the semiconductor device provided by the embodiments of the present disclosure, by arranging the epitaxial layer to at least include a first sub-epitaxial layer group composed of a first sub-epitaxial layer and a second sub-epitaxial layer, a surface of one side of the first sub-epitaxial layer away from the substrate to include a plurality of first dislocation pits, wherein sidewalls of the first dislocation pits intersect both a plane where the first sub-epitaxial layer is located and a first direction, and the second sub-epitaxial layer to at least cover the sidewalls of the first dislocation pits, the second sub-epitaxial layer grows along the sidewalls of the first dislocation pits, most of the dislocations in the second sub-epitaxial layer that originally extended upward along the first direction change their extension direction at the first dislocation pit, and the dislocations bend, thereby reducing most of the dislocations extending upward along the first direction, improving the uniformity of the epitaxial layer, improving crystal quality and product yield, and reducing costs.

Along the first direction Y, depth of the first dislocation pit 201 may be h and thickness of the first sub-epitaxial layer 221 may be H1, where $1/20H1 \le h \le 1/2H1$.

Referring to FIG. 1, along the first direction Y, the depth h of the first dislocation pit 201 and the thickness H1 of the first sub-epitaxial layer 221 need to satisfy $1/20H1 \le h \le 1/2H1$, so that the dislocations in the second sub-epitaxial layer 222 are bent at the first dislocation pit 201, reducing most of the dislocations extending upward along the first direction Y, improving the uniformity of the epitaxial layer 200, and significantly improving the crystal quality.

Further, $5\ nm \le h \le 60\ nm$, and $H1 > 100\ nm$.

Based on the embodiment above, when the depth h of the first dislocation pit 201 along the first direction Y satisfies $5\ nm \le h \le 60\ nm$, the epitaxial layer 200 with better crystal quality may be obtained. If the first dislocation pit 201 is too shallow, that is, h<5 nm, most dislocations will not have time to bend, and the lateral epitaxial growth will be completed, resulting in an insignificant improvement in the dislocation density. If the first dislocation pit 201 is too deep, that is, h>60 nm, it will be difficult to fill the first dislocation pit 201 in subsequent epitaxy, making the surface of the final epitaxial layer 200 very poor. Generally, the higher the thickness of the epitaxial layer 200, the better the crystal quality, by setting the thickness H1 of the first sub-epitaxial layer 221 along the first direction Y to satisfy H1>100 nm, the crystal quality may be further improved.

Along the first direction Y, depth of the first dislocation pit 201 may be h and thickness of the second sub-epitaxial layer 222 may be H2, where H2>h.

As shown in FIG. 1, along the first direction Y, the depth h of the first dislocation pit 201 and the thickness H2 of the second sub-epitaxial layer 222 satisfy H2>h. In the embodiment of the present disclosure, by setting the thickness H2 of the second sub-epitaxial layer 222 to be greater than the depth h of the first dislocation pit 201, when growing the second sub-epitaxial layer 222, the first error pit 201 is filled in to obtain a relatively flat surface and facilitate the growth of subsequent film layers, which may improve the quality of the epitaxial layer 200.

The first sub-epitaxial layer 221 and the second sub-epitaxial layer 222 both may include one or more of AlN, GaN, AlGaN, and InGaN.

In the embodiment of the present disclosure, the first sub-epitaxial layer 221 and the second sub-epitaxial layer 222 may be made of the same material to further improve the crystal quality, or the first sub-epitaxial layer 221 and the second sub-epitaxial layer 222 may be made of different materials. Those skilled in the art may set this according to actual conditions, and this is not limited in the embodiments of the present disclosure. Exemplarily, the material of the first sub-epitaxial layer 221 and the second sub-epitaxial layer 222 may be one or a combination of AlN, GaN, AlGaN and InGaN. In other embodiments, other common epitaxial layer materials may also be used.

Referring to FIG. 1, further, the surface of one side of the first sub-epitaxial layer 221 away from the substrate 100 includes a plurality of first dislocation pits 201 formed by corrosive gas etching, along the first direction Y, the depth of the first dislocation pits 201 is h, forming dislocation pits using corrosive gas includes that after growing the first sub-epitaxial layer 221, the hydrogen gas in the chamber must be evacuated before introducing the corrosive gas, that is, the corrosive gas may be introduced only after the hydrogen gas is evacuated. The corrosive gas includes chlorine gas, the first sub-epitaxial layer 221 and the second sub-epitaxial layer 222 both include GaN, and introduction time of the chlorine gas is t1, where ⅓ h≤t1≤h, or the first sub-epitaxial layer 221 and the second sub-epitaxial layer 222 include AlN and/or AlGaN, and introduction time of the chlorine gas is t2, where 2/3h≤t2≤2h.

In the embodiment of the present disclosure, a corrosive gas is introduced to form a plurality of first dislocation pits 201 on the surface of one side of the first sub-epitaxial layer 221 away from the substrate 100, the depth h of the first dislocation pit 201 along the first direction Y may be adjusted by setting the materials of the first sub-epitaxial layer 221 and the second sub-epitaxial layer 222, the type of corrosive gas, and controlling the introduction time of the corrosive gas, so that the dislocations are bent, most of the dislocations extending upward along the first direction Y are reduced, the uniformity of the epitaxial layer 200 is improved, and the crystal quality is improved.

Exemplarily, when the first sub-epitaxial layer 221 and the second sub-epitaxial layer 222 both include GaN, and chlorine is used as the corrosive gas to etch on the surface of one side of the first sub-epitaxial layer 221 away from the substrate 100 to form a plurality of first dislocation pits 201, the introduction time t1 of the chlorine gas and the depth h of the first dislocation pit 201 along the first direction Y satisfy 1/3h≤t1≤h, where the unit of t1 is seconds and the unit of h is nanometers. It should be noted that in the relational expression 1/3h≤t1≤h, t1 and h are only numerically related and have no dimensionality.

Continuing referring to FIG. 1, exemplarily, when the first sub-epitaxial layer 221 and the second sub-epitaxial layer 222 both include any one or a combination of AlN and AlGaN, and chlorine gas is used as a corrosive gas to etch on the surface of one side of the first sub-epitaxial layer 221 away from the substrate 100 to form a plurality of first dislocation pits 201, the introduction time t2 of chlorine gas and the depth h of the first dislocation pit 201 along the first direction Y satisfy 2/3h≤t2≤2h, where the unit of t2 is seconds and the unit of h is nanometers. In the relational expression 2/3h≤t1≤2h, t2 and h are only numerically related and have no dimensionality. It should be noted that after the growth of the first sub-epitaxial layer, H2 in the chamber must be evacuated before chlorine gas is introduced, that is, chlorine gas may be introduced only after H2 is evacuated.

It should be noted that the embodiment above only takes the corrosive gas as chlorine and the first sub-epitaxial layer 221 and the second sub-epitaxial layer 222 to include GaN or AlN and/or AlGaN as an example to illustrate the numerical relationship between the introduction time of the corrosive gas and the depth h of the first dislocation pit 201 along the first direction Y, but is not limiting. The corrosive gas may also be other gases, such as hydrogen chloride, and the first sub-epitaxial layer 221 and the second sub-epitaxial layer 222 may also be other common epitaxial materials. The type of corrosive gas and the materials of the first sub-epitaxial layer 221 and the second sub-epitaxial layer 222 both will affect the numerical relationship between the introduction time of corrosive gas and the depth h of the first dislocation pit 201 along the first direction Y, when the corrosive gas is different and/or the material of the epitaxial layer is different, the numerical relationship between the introduction time of the corrosive gas and the depth h of the first dislocation pit 201 along the first direction Y is also different. Those skilled in the art may determine the specific numerical relationship based on actual experimental statistics and analysis. In the embodiment of the present disclosure, the type of corrosive gas, materials of the first sub-epitaxial layer 221 and the second sub-epitaxial layer 222, and the numerical relationship between the introduction time of the corrosive gas and the depth h of the first dislocation pit 201 along the first direction Y are not limited.

In the embodiment of the present disclosure, by introducing corrosive gas during the epitaxial growth process, just by evacuating the hydrogen gas in the chamber before introducing the corrosive gas, the surface of one side of the first sub-epitaxial layer away from the substrate is etched by using corrosive gas to form a plurality of first dislocation pits, since the entire process is carried out within the system and does not need to be taken out of the system, more contaminants and defects will not be introduced, which ensures the cleanliness of the product and simplifies the process and growth process.

Figure 2:
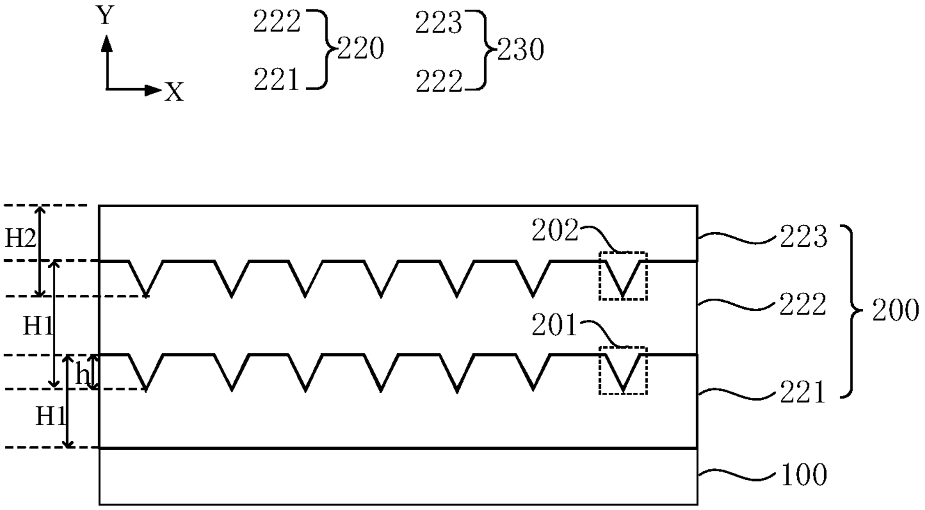
FIG. 2 is a schematic structural diagram of another epitaxial structure of a semiconductor device provided by an embodiment of the present disclosure.

FIG. 2 is a schematic structural diagram of another epitaxial structure of a semiconductor device provided by an embodiment of the present disclosure. As shown in FIG. 2, the epitaxial layer 200 may further include a second sub-epitaxial layer group 230 located on one side of the first sub-epitaxial layer group 220 away from the substrate 100, the second sub-epitaxial layer group 230 includes the second sub-epitaxial layer 222 and a third sub-epitaxial layer 223, the third sub-epitaxial layer 223 being located on one side of the second sub-epitaxial layer 222 away from the substrate 100, and a surface of one side of the second sub-epitaxial layer 222 away from the substrate 100 includes a plurality of second dislocation pits 202, and sidewalls of the second dislocation pits 202 intersect both a plane where the second sub-epitaxial layer 222 is located and the first direction Y, and the third sub-epitaxial layer 223 covers at least the sidewalls of the second dislocation pits 202.

Exemplarily, referring to FIG. 2, the epitaxial layer 200 may further include a second sub-epitaxial layer group 230, and the second sub-epitaxial layer group 230 includes a second sub-epitaxial layer 222 and a third sub-epitaxial layer 223 arranged in stack. During the epitaxial growth process, the dislocations on the surface of one side of the first sub-epitaxial layer 221 away from the substrate 100 may be etched into dislocation pits by introducing corrosive gases, etc. to form the first sub-epitaxial layer 221 including a plurality of first dislocation pits 201. The second sub-epitaxial layer 222 continues to grow, since the first dislocation pit 201 is in the shape of an inverted triangle along the first direction Y, the second sub-epitaxial layer 222 grows along the sidewalls of the first dislocation pit 201, most of the dislocations in the second sub-epitaxial layer 222 that originally extended upward along the first direction Y will change their extension direction at the first dislocation pit 201, and the dislocations will bend and extend to the left or right, the dislocations extending to the left and right are docked to form similar semicircular rings, leading to the annihilation of dislocations, thus reducing most of the dislocations extending upward along the first direction Y. After the second sub-epitaxial layer 222 fills the first dislocation pit 201 to form a relatively flat surface, the dislocations on the surface of one side of the second sub-epitaxial layer 222 away from the substrate 100 may be etched into dislocation pits by introducing corrosive gas or other methods, to form a second sub-epitaxial layer 222 including a plurality of second dislocation pits 202, and then the third sub-epitaxial layer 223 continues to grow. Along the first direction Y, the second dislocation pit 202 is in the shape of an inverted triangle; similarly, the third sub-epitaxial layer 223 grows along the sidewalls of the second dislocation pit 202, most of the dislocations in the third sub-epitaxial layer 223 that originally extended upward along the first direction Y will change their extension direction at the second dislocation pit 202, bend, and extend to the left and right sides, which results in the annihilation of dislocations, thereby further reducing the majority of dislocations extending upward in the first direction Y. The two barriers formed by the first sub-epitaxial layer group 220 and the second sub-epitaxial layer group 230 form a double barrier, which can significantly reduce a large number of dislocations extending upward along the first direction Y, which significantly improves crystal quality and product yield, and reduces costs.

Further, the third sub-epitaxial layer 223 at least covers the sidewalls of the second dislocation pit 202, that is, the third sub-epitaxial layer 223 only covers the sidewalls of the second dislocation pit 202 so that the third sub-epitaxial layer 223 grows along the sidewalls of the second dislocation pit 202 and changes the extension direction of the dislocation. Alternatively, referring to FIG. 2, the third sub-epitaxial layer 223 fills the second dislocation pit 202 to facilitate the growth of subsequent film layers and further improve the crystal quality.

It should be noted that this embodiment only takes the epitaxial layer 200 including the first sub-epitaxial layer group 220 and the second sub-epitaxial layer group 230 as an example for illustration and is not limiting. Along the first direction Y, the epitaxial layer 200 may further include a third sub-epitaxial layer group, a fourth sub-epitaxial layer group, a fifth sub-epitaxial layer group, etc. arranged in sequence, taking the third sub-epitaxial layer group as an example, the third sub-epitaxial layer group is located on one side of the second sub-epitaxial layer group 230 away from the substrate 100, the third sub-epitaxial layer group includes a third sub-epitaxial layer 223 and a fourth sub-epitaxial layer arranged in stack, the surface of one side of the third sub-epitaxial layer 223 away from the substrate 100 includes a plurality of third dislocation pits, sidewalls of the third dislocation pit intersect with both the plane where the third sub-epitaxial layer is located and the first direction, and the fourth sub-epitaxial layer at least covers the sidewalls of the third dislocation pit. By analogy, multiple barriers are formed along the first direction Y, through the layers of barrier, a large number of dislocations extending upward along the first direction Y may be greatly reduced, thereby significantly improving crystal quality and product yield, and reducing costs. In addition, along the first direction Y, the depth h of all dislocation pits in the epitaxial layer 200 and the thickness H1 of the film layer where the dislocation pits are located satisfy $1/20H1 \leq h \leq 1/2H1$, and may be, 5 nm≤h≤60 nm, H1>100 nm, the thickness H2 of the film layer on one side away from the substrate 100 where the dislocation pit is located satisfies H2>h. In addition, the shape of the dislocation pits formed by etching, the film material, the corrosive gas introduced, and the numerical relationship of the depth of the dislocation pits described in any embodiment of the present disclosure are all applicable to this embodiment.

It should be noted that in the present application, in the process of using corrosive gas etching to form dislocation pits, it is necessary to evacuate the hydrogen gas in the chamber before introducing the corrosive gas.

Figure 3:
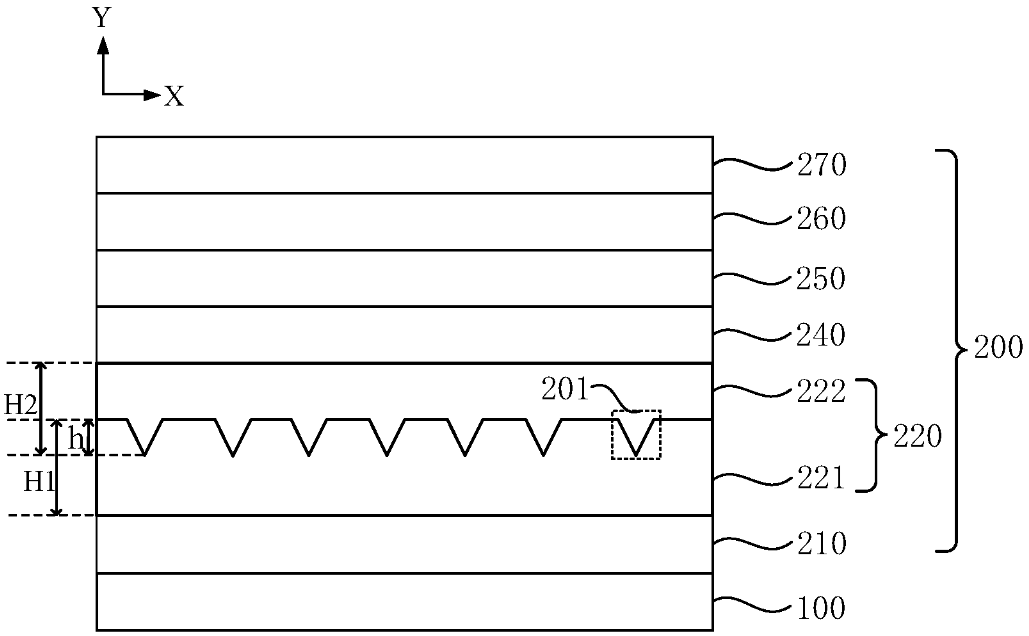
FIG. 3 is a schematic structural diagram of yet another epitaxial structure of a semiconductor device provided by an embodiment of the present disclosure.

FIG. 3 is a schematic structural diagram of yet another epitaxial structure of a semiconductor device provided by an embodiment of the present disclosure. As shown in FIG. 3, based on the above embodiments, the epitaxial layer 200 further includes a nucleation layer 210 located on one side of the first sub-epitaxial layer 221 close to the substrate 100, a channel layer 240 located on one side of the second sub-epitaxial layer 222 away from the substrate 100, a spacer layer 250 located on one side of the channel layer 240 away from the substrate 100, a barrier layer 260 located on one side of the spacer layer 250 away from the substrate 100, the barrier layer 260 and the channel layer 240 forming a heterojunction structure, and a cap layer 270 located on one side of the barrier layer 260 away from the substrate 100.

Referring to FIG. 3, along the first direction Y, the epitaxial layer 200 includes a nucleation layer 210, a first sub-epitaxial layer 221, a second sub-epitaxial layer 222, a channel layer 240, a spacer layer 250, a barrier layer 260, and a cap layer 270 which are stacked in sequence.

The nucleation layer 210 affects the crystal quality, surface morphology, electrical properties and other parameters of other film layers located above the nucleation layer 210 in the epitaxial layer 200, the nucleation layer 210 mainly functions to match the material of the substrate 100 and the semiconductor material layer in the heterojunction structure of the epitaxial layer 200.

The surface of one side of the first sub-epitaxial layer 221 away from the substrate 100 includes a plurality of first dislocation pits 201, and the second sub-epitaxial layer 222 grows along the sidewalls of the first dislocation pits 201, most of the dislocations in the second sub-epitaxial layer 222 that originally extended upward along the first direction Y change their extension direction at the first dislocation pit 201, and the dislocations are bent, thereby reducing most of the dislocations extending upward along the first direction Y to improve the uniformity of the epitaxial layer, improve crystal quality and product yield, and reduce costs. Therein, both the first sub-epitaxial layer 221 and the second sub-epitaxial layer 222 may be one or a combination of more common epitaxial layers such as AlN, GaN, AlGaN, and InGaN.

The channel layer 240 may be a GaN channel layer, and the channel layer 240 is used to improve the interface quality of the two-dimensional electron gas channel to obtain better two-dimensional electron gas concentration and mobility.

The spacer layer 250 may be an AlN spacer layer, and the spacer layer 250 may raise the potential barrier, increase the confinement of the two-dimensional electron gas, while reducing alloy scattering and improving mobility.

The barrier layer 260 may be an AlGaN barrier layer, and the barrier layer 260 and the channel layer 240 together form a heterojunction structure, so that the channel layer 240 may provide a channel for two-dimensional electron gas movement.

The main function of the cap layer 270 is to reduce surface states, reduce surface leakage of subsequent semiconductor devices, and suppress current collapse, thereby improving the performance and reliability of the epitaxial structure and semiconductor devices. The material of the cap layer 270 may be Group III nitride, preferably P-type doped gallium nitride (P-GaN), the P-GaN structure can effectively reduce the barrier height of the AlGaN layer.

Figure 4:
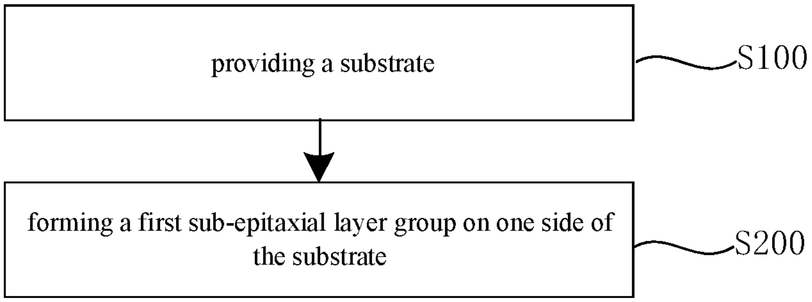
FIG. 4 is a flow chart of a method of manufacturing an epitaxial structure of a semiconductor device provided by an embodiment of the present disclosure.
Figure 5:
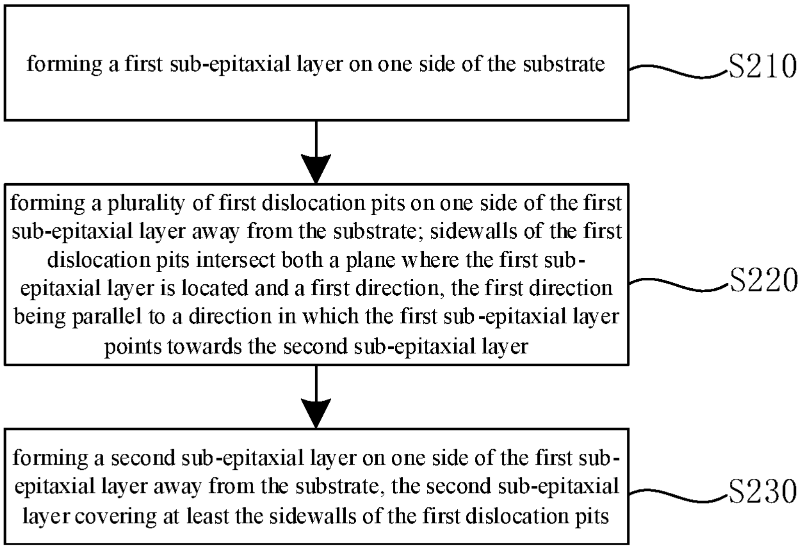
FIG. 5 is a flow chart of forming a first sub-epitaxial layer group on one side of the substrate in an embodiment of the present disclosure.

Based on the same inventive concept, embodiments of the present disclosure further provide a method of manufacturing an epitaxial structure of a semiconductor device. The manufacturing method may manufacture the epitaxial structure of a semiconductor device provided by any embodiment of the present disclosure. FIG. 4 is a flow chart of a method of manufacturing an epitaxial structure of a semiconductor device provided by an embodiment of the present disclosure. FIG. 5 is a flow chart of forming a first sub-epitaxial layer group on one side of the substrate in an embodiment of the present disclosure. As shown in FIGS. 4 and 5, the manufacturing method includes:

S100: providing a substrate.

The manufacturing method and material of the substrate are not limited. Exemplarily, the manufacturing method of the substrate may be an atmospheric pressure chemical vapor deposition method, a sub-normal pressure chemical vapor deposition method, a metal-organic compound vapor deposition method, a low-pressure chemical vapor deposition method, a high-density plasma chemical vapor deposition method, an ultra-high vacuum chemical vapor deposition method, a plasma-enhanced chemical vapor deposition method, a catalyst chemical vapor deposition method, a hybrid physical chemical vapor deposition method, a fast thermal chemical vapor deposition method, a gas phase epitaxy method, a pulsed laser deposition method, an ion layer epitaxy method, a molecular beam epitaxy method, a sputtering method, or an evaporation method. The material of the substrate may be one or a combination of gallium nitride, aluminum gallium nitride, indium gallium nitride, aluminum indium gallium nitride, indium phosphide, gallium arsenide, silicon carbide, diamond, sapphire, germanium, silicon, or any other material that is capable of growing Group III nitrides.

S200: forming a first sub-epitaxial layer group on one side of the substrate.

Therein, forming a first sub-epitaxial layer group on one side of the substrate includes:

S210: forming a first sub-epitaxial layer on one side of the substrate.

S220: forming a plurality of first dislocation pits on one side of the first sub-epitaxial layer away from the substrate, sidewalls of the first dislocation pits intersect both a plane where the first sub-epitaxial layer is located and a first direction, the first direction being parallel to a direction in which the first sub-epitaxial layer points towards the second sub-epitaxial layer.

During the epitaxial growth process, in-situ etching may be performed by introducing corrosive gases such as chlorine into the MOCVD (Metal Organic Chemical Vapor Deposition) system, usually etching will etch the dislocations in the epitaxial layer into dislocation pits, thereby forming a plurality of first dislocation pits on the surface one side of the first sub-epitaxial layer away from the substrate.

After growing the first sub-epitaxial layer, before introducing the corrosive gas, the hydrogen gas in the chamber is first evacuated, and only after the hydrogen gas is evacuated can the corrosive gas be introduced.

S230: forming a second sub-epitaxial layer on one side of the first sub-epitaxial layer away from the substrate, the second sub-epitaxial layer covering at least the sidewalls of the first dislocation pits.

During the subsequent epitaxial growth, the second sub-epitaxial layer begins to grow along the sidewalls of the dislocation pit, and lateral epitaxy occurs, during the lateral epitaxy process, the dislocations will bend, which achieves the effect of reducing most of the dislocations extending upward along the first direction and improving the crystal quality.

With the method of manufacturing an epitaxial structure of a semiconductor device provided by embodiments of the present disclosure, by arranging the epitaxial layer to at least include a first sub-epitaxial layer group composed of a first sub-epitaxial layer and a second sub-epitaxial layer, a surface of one side of the first sub-epitaxial layer away from the substrate to include a plurality of first dislocation pits, wherein sidewalls of the first dislocation pits intersect both a plane where the first sub-epitaxial layer is located and a first direction, and the second sub-epitaxial layer to at least cover the sidewalls of the first dislocation pits, the second sub-epitaxial layer grows along the sidewalls of the first dislocation pits, most of the dislocations in the second sub-epitaxial layer that originally extended upward along the first direction change their extension direction at the first dislocation pit, and the dislocations bend, thereby reducing most of the dislocations extending upward along the first direction, improving the uniformity of the epitaxial layer, improving crystal quality and product yield, and reducing costs.

Figure 6:
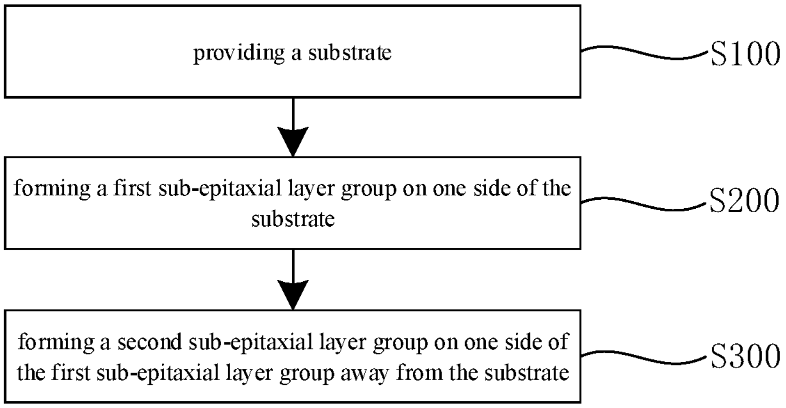
FIG. 6 is a flow chart of a method of manufacturing another epitaxial structure of a semiconductor device provided by an embodiment of the present disclosure.
Figure 7:
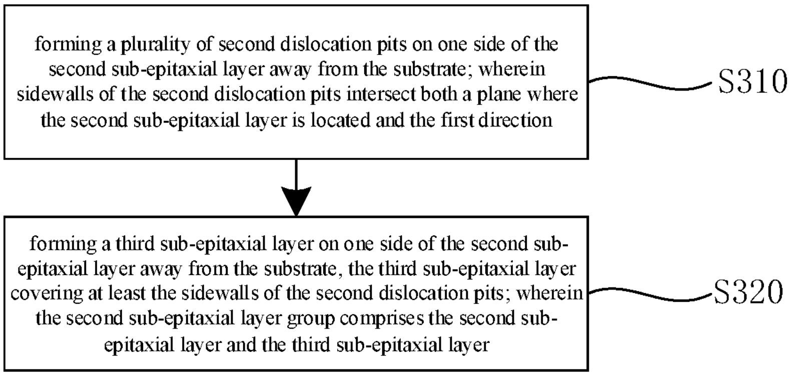
FIG. 7 is a flow chart of forming a second sub-epitaxial layer group on one side of the first sub-epitaxial layer group away from the substrate in an embodiment of the present disclosure.

FIG. 6 is a flow chart of a method of manufacturing another epitaxial structure of a semiconductor device provided by an embodiment of the present disclosure. FIG. 7 is a flow chart of forming a second sub-epitaxial layer group on one side of the first sub-epitaxial layer group away from the substrate in an embodiment of the present disclosure. As shown in FIGS. 6 and 7, the manufacturing method above may further include:

S300: forming a second sub-epitaxial layer group on one side of the first sub-epitaxial layer group away from the substrate.

Therein, forming a second sub-epitaxial layer group on one side of the first sub-epitaxial layer group away from the substrate includes:

S310: forming a plurality of second dislocation pits on one side of the second sub-epitaxial layer away from the substrate, wherein sidewalls of the second dislocation pits intersect both a plane where the second sub-epitaxial layer is located and the first direction.

The second sub-epitaxial layer fills the first dislocation pit; pit, after forming a relatively flat surface, in-situ etching may be performed again by introducing corrosive gas to etch the dislocations on the surface of one side of the second sub-epitaxial layer away from the substrate into dislocation pits, to form a second sub-epitaxial layer including a plurality of second dislocation pits, and then continue to grow a third sub-epitaxial layer.

After growing the second sub-epitaxial layer, before introducing the corrosive gas, the hydrogen gas in the chamber is first evacuated, and only after the hydrogen gas is evacuated can the corrosive gas be introduced.

S320: forming a third sub-epitaxial layer on one side of the second sub-epitaxial layer away from the substrate, the third sub-epitaxial layer covering at least the sidewalls of the second dislocation pits, wherein the second sub-epitaxial layer group includes the second sub-epitaxial layer and the third sub-epitaxial layer.

Along the first direction, since the second dislocation pit is in the shape of an inverted triangle, the third sub-epitaxial layer begins to grow along the sidewalls of the second dislocation pit, most of the dislocations in the third sub-epitaxial layer that originally extended upward along the first direction will change their extension direction at the second dislocation pit, bend, and extend to the left or right, which results in the annihilation of dislocations, further reducing the number of dislocations extending upward in the first direction.

This embodiment only takes two in-situ etchings as an example for description, and the epitaxial layer may be etched once or multiple times. For example, after the first sub-epitaxial layer is etched, the second sub-epitaxial layer grows, and the surface of one side of the second sub-epitaxial layer is etched, then the third sub-epitaxial layer grows, and the surface of one side of the third sub-epitaxial layer is etched, and then the fourth sub-epitaxial layer grows, and this is repeated one or more times, so that multiple barriers are formed to significantly reduce a large number of dislocations extending upward along the first direction, significantly improving crystal quality and product yield.

In this embodiment, the epitaxial layer includes a first sub-epitaxial layer, a second sub-epitaxial layer, and a third sub-epitaxial layer arranged in a stack. The surface of one side of the first sub-epitaxial layer away from the substrate includes a plurality of first dislocation pits, and the second sub-epitaxial layer grows along the sidewalls of the first dislocation pits, the surface of one side of the second sub-epitaxial layer away from the substrate includes a plurality of second dislocation pits, and the third sub-epitaxial layer grows along the sidewalls of the second dislocation pits, so that it changes the direction of the dislocations extending upward in the first direction in the epitaxial layer, causing the dislocations to bend; the first sub-epitaxial layer group and the second sub-epitaxial layer group form two barriers, forming a double barrier, which may significantly reduce a large number of dislocations extending upward along the first direction, thereby significantly improving crystal quality and product yield, and reducing costs.

Figure 8:
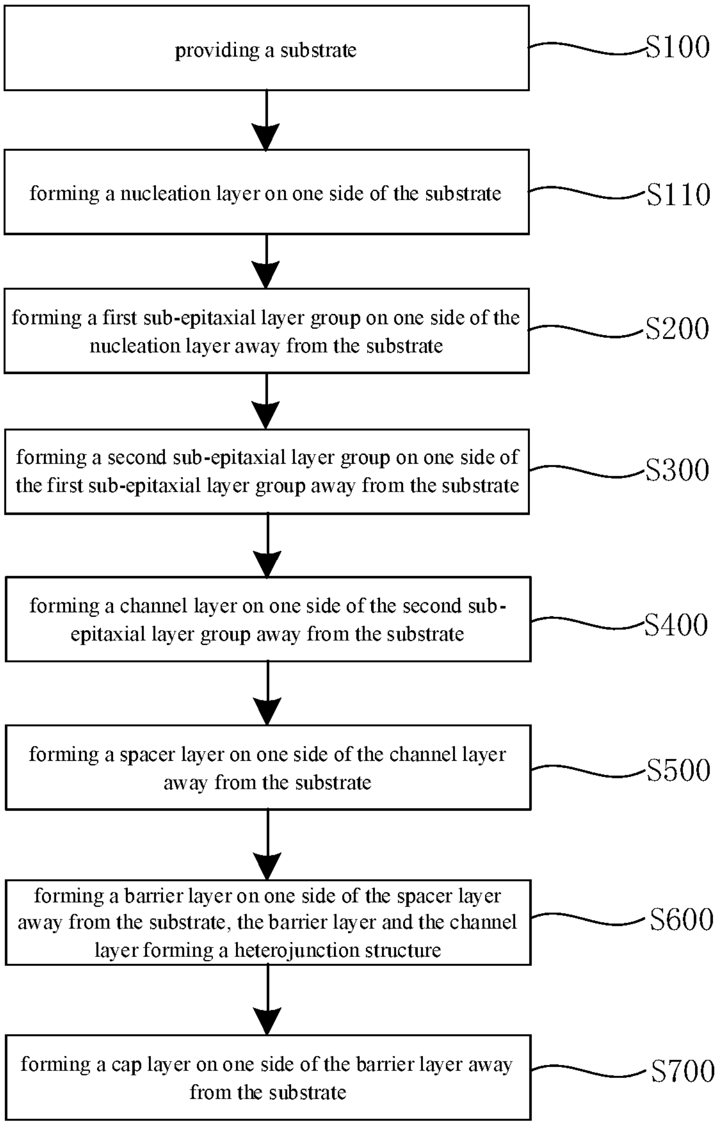
FIG. 8 is a flow chart of a method of manufacturing yet another epitaxial structure of a semiconductor device provided by an embodiment of the present disclosure.

FIG. 8 is a flow chart of a method of manufacturing yet another epitaxial structure of a semiconductor device provided by an embodiment of the present disclosure, referring to FIG. 8, based on the embodiments above, the manufacturing method may further include:

S110: forming a nucleation layer on one side of the substrate.

S200: forming a first sub-epitaxial layer group on one side of the nucleation layer away from the substrate.

S300: forming a second sub-epitaxial layer group on one side of the first sub-epitaxial layer group away from the substrate.

S400: forming a channel layer on one side of the second sub-epitaxial layer group away from the substrate.

S500: forming a spacer layer on one side of the channel layer away from the substrate.

S600: forming a barrier layer on one side of the spacer layer away from the substrate, the barrier layer and the channel layer forming a heterojunction structure.

S700: forming a cap layer on one side of the barrier layer away from the substrate.

In the method of manufacturing an epitaxial structure of a semiconductor device provided by the embodiment of the present disclosure, the nucleation layer is used to match the substrate material and the semiconductor material layer in the heterojunction structure in the epitaxial layer, the extension direction of dislocations in epitaxy is changed by the first sub-epitaxial layer group and the second sub-epitaxial layer group, so that the dislocations are bent and a large number of dislocations extending upward along the first direction are reduced, to improve crystal quality and product yield; by improving the interface quality at the two-dimensional electron gas channel through the channel layer, better two-dimensional electron gas concentration and mobility are obtained, by raising the potential barrier through the spacer layer, the confinement of the two-dimensional electron gas is increased, while reducing alloy scattering and improving mobility, by forming a heterojunction structure through the barrier layer and the channel layer together, to form a two-dimensional electron gas movement channel, by reducing the surface state through the cap layer, the surface leakage of subsequent semiconductor devices is reduced, current collapse is suppressed, and the performance and reliability of epitaxial structures and semiconductor devices are improved.

Figure 9:
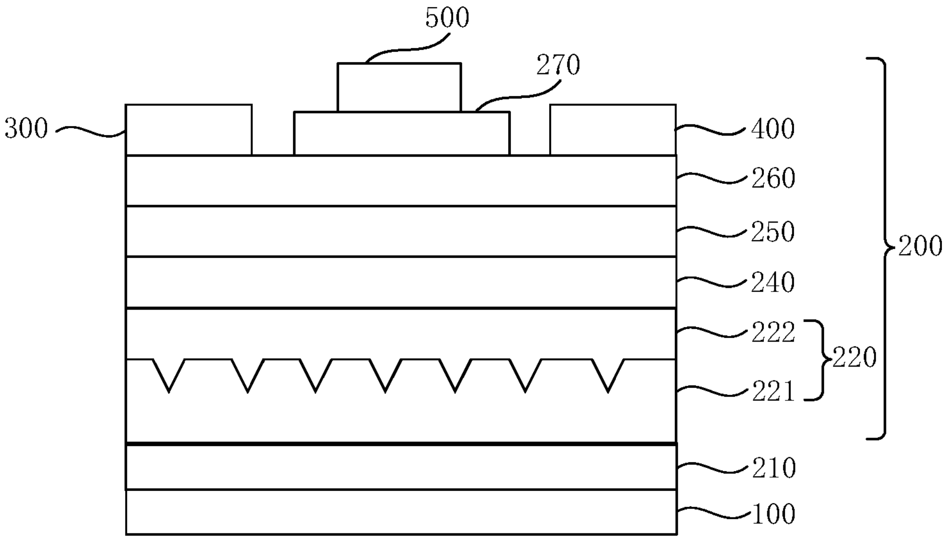
FIG. 9 is a schematic structural diagram of a semiconductor device provided by an embodiment of the present disclosure.

Based on the same inventive concept, an embodiment of the present disclosure further provides a semiconductor device, which includes the epitaxial structure of a semiconductor device provided by any embodiment of the present disclosure. FIG. 9 is a schematic structural diagram of a semiconductor device provided by an embodiment of the present disclosure. As shown in FIG. 9, the epitaxial structure of the semiconductor device includes a substrate 100 as well as a nucleation layer 210, a first sub-epitaxial layer group 220, a channel layer 240, a spacer layer 250, a barrier layer 260, and a cap layer 270 sequentially located on one side of the substrate 100. The semiconductor device further includes a source 300 and a drain 400 located on one side of the barrier layer 260 away from the substrate 100, and a gate

500 located on one side of the cap layer 270 away from the substrate 100, the gate 500 being located between the source 300 and the drain 400.

Exemplarily, the source 300 and the drain 400 are located on one side of the barrier layer 260 away from the substrate 100, and the source 300 and the drain 400 respectively form ohmic contacts with the barrier layer 260. The gate 500 is located between the source 300 and the drain 400 and is located on one side of the cap layer 270 away from the substrate 100. The gate 500 forms a Schottky contact with the cap layer 270.

The semiconductor devices provided by the embodiments of the present disclosure include, but are not limited to high power GaN High Electron Mobility Transistors (HEMTs) under high voltage and high current, transistors having a Silicon-On-Insulator (SOI) structure, gallium arsenide (GaAs) based transistors and Metal-Oxide-Semiconductor Field-Effect Transistors (MOSFETs), Metal-Semiconductor Field-Effect Transistors (MISFETs), Double Heterojunction Field-Effect Transistors (DHFETs), Junction Field-Effect Transistors (JFETs), Metal-Semiconductor Field-Effect Transistors (MESFETs), and Metal-Semiconductor Heterojunction Field-Effect Transistors (MISHFETs).

With the semiconductor device provided by the embodiments of the present disclosure, the extending direction of dislocations in epitaxy is changed through the first sub-epitaxial layer group, so that the dislocations are bent and a large number of dislocations extending upward along the first direction are reduced, to improve crystal quality and product yield. The substrate material and the semiconductor material layer in the heterojunction structure in the epitaxial layer are matched through the nucleation layer, the channel layer is used to improve the interface quality at the two-dimensional electron gas channel and obtain better two-dimensional electron gas concentration and mobility, the potential barrier is raised through the spacer layer to increase the confinement of the two-dimensional electron gas, while reducing alloy scattering and improving mobility, the barrier layer and the channel layer together form a heterojunction structure to form a two-dimensional electron gas movement channel, the surface state is reduced through the cap layer, the surface leakage of subsequent semiconductor devices is reduced, and current collapse is suppressed, thereby improving the performance and reliability of epitaxial structures and semiconductor devices.

Note that the above are only the example embodiments of the present disclosure and the technical principles used. Those skilled in the art will understand that the present disclosure is not limited to the specific embodiments described herein, and for those skilled in the art, various kinds of obvious changes, readjustments, mutual combinations, and substitutions can be made without departing from the scope of the present disclosure. Therefore, although the present disclosure has been described in detail through the above embodiments, the present disclosure is not limited to the above embodiments, and without departing from the concept of the disclosure, the disclosure may further include more other equivalent embodiments, and the scope of the disclosure is determined by the scope of the appended claims.

What is claimed is:

1. An epitaxial structure of a semiconductor device comprising:

a substrate; and an epitaxial layer located on one side of the substrate, the epitaxial layer comprising at least a first sub-epitaxial layer group, the first sub-epitaxial layer group comprising a first sub-epitaxial layer and a second sub-epitaxial layer arranged in a stack, wherein the second sub-epitaxial layer is located on one side of the first sub-epitaxial layer opposite the substrate, wherein a surface of one side of the first sub-epitaxial layer opposite the substrate comprises a plurality of first dislocation pits, wherein sidewalls of the first dislocation pits intersect both a plane where the first sub-epitaxial layer is located and a first direction, wherein the first direction is parallel to a direction in which the first sub-epitaxial layer points towards the second sub-epitaxial layer, and wherein the second sub-epitaxial layer grows along the sidewalls of the first dislocation pits, and covers at least the sidewalls of the first dislocation pits;

wherein, along the first direction, depth of the first dislocation pit is h, wherein thickness of the first sub-epitaxial layer is H1, and wherein thickness of the second sub-epitaxial layer is H2:

wherein 5 nm≤h≤60 nm and H1>100 nm;

wherein H2>h; and wherein 1/20H1<h≤1/2H1.

2. The epitaxial structure according to claim 1, wherein the epitaxial layer further comprises a second sub-epitaxial layer group located on one side of the first sub-epitaxial layer group opposite the substrate;

wherein the second sub-epitaxial layer group comprises the second sub-epitaxial layer and a third sub-epitaxial layer, and wherein the third sub-epitaxial layer is located on one side of the second sub-epitaxial layer opposite the substrate; and wherein a surface of one side of the second sub-epitaxial layer opposite the substrate comprises a plurality of second dislocation pits, wherein sidewalls of the second dislocation pits intersect both a plane where the second sub-epitaxial layer is located and the first direction, and wherein the third sub-epitaxial layer covers at least the sidewalls of the second dislocation pits.

3. The epitaxial structure according to claim 1, wherein the first sub-epitaxial layer and the second sub-epitaxial layer both comprise one or more of AlN, GaN, AlGaN, and InGaN.

4. The epitaxial structure according to claim 3, wherein a surface of one side of the first sub-epitaxial layer opposite the substrate comprises a plurality of first dislocation pits formed by corrosive gas etching, and wherein along the first direction, depth of the first dislocation pits is h;

wherein the corrosive gas comprises chlorine gas;

wherein i) the first sub-epitaxial layer and the second sub-epitaxial layer both comprise GaN, wherein an introduction time of the chlorine gas is t1, and wherein 1/3h≤t1≤h; or wherein ii) the first sub-epitaxial layer and the second sub-epitaxial layer comprise at least one of AlN and AlGaN, wherein the introduction time of the chlorine gas is t2, and wherein 2/3h≤t2≤2h.

5. A semiconductor device comprising the epitaxial structure according to claim 1, the epitaxial structure comprising a substrate as well as a nucleation layer, a first sub-epitaxial layer group, a channel layer, a spacer layer, a barrier layer, and a cap layer sequentially located on one side of the substrate;

wherein the semiconductor device further comprises:

a source and a drain located on one side of the barrier layer opposite the substrate; and a gate located on one side of the cap layer opposite the substrate, the gate being located between the source and the drain.

6. A method of manufacturing an epitaxial structure of a semiconductor device, for manufacturing the epitaxial structure according to claim 1, the method comprising:

providing a substrate;

forming a first sub-epitaxial layer group on one side of the substrate;

wherein forming a first sub-epitaxial layer group on one side of the substrate comprises:

forming a first sub-epitaxial layer on one side of the substrate;

forming a plurality of first dislocation pits on one side of the first sub-epitaxial layer opposite the substrate, wherein sidewalls of the first dislocation pits intersect both a plane where the first sub-epitaxial layer is located and a first direction, and wherein the first direction is parallel to a direction in which the first sub-epitaxial layer points towards the second sub-epitaxial layer; and forming a second sub-epitaxial layer on one side of the first sub-epitaxial layer opposite the substrate, the second sub-epitaxial layer covering at least the sidewalls of the first dislocation pits.

7. The manufacturing method according to claim 6, wherein in the step of forming a plurality of first dislocation pits on one side of the first sub-epitaxial layer opposite the substrate:

hydrogen gas is evacuated from a chamber, and after the hydrogen gas is evacuated, corrosive gas is introduced to form the plurality of first dislocation pits.

8. The manufacturing method according to claim 6, further comprising:

forming a second sub-epitaxial layer group on one side of the first sub-epitaxial layer group opposite the substrate;

wherein, forming a second sub-epitaxial layer group on one side of the first sub-epitaxial layer group opposite the substrate comprises:

forming a plurality of second dislocation pits on one side of the second sub-epitaxial layer opposite the substrate, wherein sidewalls of the second dislocation pits intersect both a plane where the second sub-epitaxial layer is located and the first direction; and forming a third sub-epitaxial layer on one side of the second sub-epitaxial layer opposite the substrate, wherein the third sub-epitaxial layer covering at least the sidewalls of the second dislocation pits, and wherein the second sub-epitaxial layer group comprises the second sub-epitaxial layer and the third sub-epitaxial layer.

9. The manufacturing method according to claim 8, wherein in the step of forming a plurality of second dislocation pits on one side of the second sub-epitaxial layer away from the substrate:

hydrogen gas is evacuated from a chamber, and after the hydrogen gas is evacuated, corrosive gas is introduced to form the plurality of second dislocation pits.

* * * * *